United States Patent
Ezawa et al.

(10) Patent No.: US 6,404,051 B1
(45) Date of Patent: Jun. 11, 2002

(54) SEMICONDUCTOR DEVICE HAVING A PROTRUDING BUMP ELECTRODE

(75) Inventors: Hirokazu Ezawa, Tokyo; Masahiro Miyata, Urayasu, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 08/409,933

(22) Filed: Mar. 23, 1995

Related U.S. Application Data

(63) Continuation of application No. 08/075,373, filed on Jun. 14, 1993, now abandoned.

(30) Foreign Application Priority Data

Aug. 27, 1992 (JP) .............................. 4-228343

(51) Int. Cl.[7] .............................................. H01L 29/40
(52) U.S. Cl. ................. 257/734; 257/735; 257/736; 257/737; 257/738; 257/692; 257/751; 257/780; 257/781
(58) Field of Search ................. 257/666, 667, 257/692, 735, 736, 737, 738, 676, 734, 780, 781, 751

(56) References Cited

U.S. PATENT DOCUMENTS

| | | | |
|---|---|---|---|
| 3,436,818 A | * 4/1969 | Merrin et al. | ............... 257/781 |
| 3,714,520 A | * 1/1973 | Engeler et al. | ............. 257/751 |
| 5,172,212 A | * 12/1992 | Baba | ......................... 257/738 |
| 5,180,691 A | * 1/1993 | Adachi et al. | .............. 437/235 |

FOREIGN PATENT DOCUMENTS

| EP | 3702354 | * 7/1987 | .................. 257/738 |
|---|---|---|---|
| JP | 62232147 | * 10/1987 | .................. 257/676 |
| JP | 63-36548 | 2/1988 | |
| JP | 63-036548 A | * 2/1988 | ........... H01L/21/92 |
| JP | 1-164041 | 6/1989 | |
| JP | 02-159034 A | * 6/1990 | ......... H01L/21/321 |
| JP | 2-159034 | 6/1990 | |
| JP | 3-62525 | 3/1991 | |
| JP | 3-062525 A | * 3/1991 | ......... H01L/21/321 |
| JP | 3-231435 | 10/1991 | |
| JP | 4-237149 | 8/1992 | |

* cited by examiner

Primary Examiner—Eddie Lee
Assistant Examiner—Matthew E. Warren
(74) Attorney, Agent, or Firm—Finnegan, Henderson, Farabow, Garrett & Dunner, L.L.P.

(57) ABSTRACT

A semiconductor device includes at least one bump electrode for inputting and outputting signals to and from the semiconductor device. The bump electrode is positioned above a semiconductor substrate with an electrode pad and metal layer disposed therebetween. A resin film covers a surface of the semiconductor substrate except at a top area of the bump electrode. The bump electrode projects a sufficient distance above a top surface of the resin film so that heat induced defects are reduced and pressure exerted on a top area of the bump electrode is absorbed to suppress occurrence of cracks in the resin film.

12 Claims, 3 Drawing Sheets

SEMICONDUCTOR DEVICE HAVING A PROTRUDING BUMP ELECTRODE

This application is a continuation, of application Ser. No. 08/075,373 filed Jun. 14, 1993, now abandoned.

BACKGROUND OF THE INVENTION

1. Field of the Invention

The present invention relates to a semiconductor device having a bump electrode as an electrode for inputting and outputting signals to and from a semiconductor element and a method for manufacturing the same, and in particular to a semiconductor device which can suppress occurrence of cracks at an area below the bump electrode upon the bonding of an inner lead and can achieve an enhanced heat resistance cycle property after the inner lead bonding has been carried out and a method for manufacturing the same.

2. Description of the Related Art

Conventionally bump electrodes have been employed as those electrodes for a TAB type and a COB (chip on board) type semiconductor device.

FIGS. 1 to 3, each, are a cross-sectional view showing a major section of a semiconductor device having a conventional bump electrode. This structure is disclosed, for example, in Published Unexamined Japanese Patent Application H-1-1640401, but involves drawbacks as will be set out below.

As shown in FIG. 1, a bump electrode 102 is provided on a semiconductor substrate 101. A resin film 103 is covered over the surface of the semiconductor substrate 101 except at the bump electrode 102. The surface of the resin film 103 is flush with that of the bump electrode 102 at an area 105 adjacent the bump electrode 102. The resin film 103 serves as a film for protection against any external mechanical damage due to a dicing process, etc., and can prevent a lead shorting whereby direct lead-to-substrate contact occurs. However, the aforementioned semiconductor structure has the following drawbacks. To be specific, upon the bonding of the lead to the device shown in FIG. 2, the lead 107 is pushed with a pressure P by a bonding tool 106, causing the lead 107 to be pushed into the bump electrode 102. At this time, the bump electrode 102 is deformed so that a crack occurs in the resin film 103 as indicated by reference numeral 108. There is a fear that, upon the occurrence of such a crack in the resin film 103, water and harmful impurities will intrude into the substrate (device body) 101 via the crack 108. This adversely affects the device reliability.

FIG. 3 is a cross-sectional view, as taken along line III—III in FIG. 2. As shown in FIG. 3, the lead 107 makes direct contact with the resin film 103 in the semiconductor device of FIG. 1. In this state, upon the thermocompression bonding of the lead 107 to the device, heat is transmitted via the lead 107 to the resin film 103 to cause the resin film 103 to be affected by the heat at an area (heat-affected area) indicated by reference numeral 109 in FIG. 3. The resin film 103, being so heat-affected, gives a bad effect to the device reliability. In addition to the aforementioned drawbacks encountered upon the pushing of the lead onto the bump electrode and upon the thermocompression bonding, an eutectic alloy, i.e., an alloy of tin (Sn) plated to the surface of the lead 107 and gold (Au) contained in the bump electrode 102, is not adequately formed due to the lead 107 contacting with the resin film 103 upon the pushing of the lead 107 into the bump electrode 102. As a result, the lead 107 is liable to be separated off the bump electrode 102.

SUMMARY OF THE INVENTION

It is accordingly the object of the present invention to provide a semiconductor device which can suppress occurrence of cracks at an area below a bump electrode upon the bonding of an inner lead and can achieve an enhanced heat resistance cycle property after the bonding of the inner lead and a method for manufacturing the same.

According to one aspect of the present invention there is provided a semiconductor device comprising a semiconductor substrate, at least one bump electrode provided over the semiconductor substrate to allow signals to be input and output to and from a semiconductor device, and a resin film covered on a surface of the semiconductor substrate except at a top area of the bump electrode, wherein the top area of the bump electrode is more projected than a top area of the resin film.

According to another aspect of the present invention there is provided a method for manufacturing a semiconductor device comprising the steps of forming at least one electrode pad over a semiconductor substrate, providing an opening in a surface portion of the electrode pad and forming a passivation film over a surface of the semiconductor substrate and that of the electrode pad, forming a metal film over the surface of the electrode pad at an area of the opening and over the passivation film near the opening, providing a bump electrode over the metal layer, forming an organic insulating film over the bump electrode and passivation film, and etching back the organic insulating film to allow a top area of the bump electrode to be more projected than a top area of the organic insulating film.

The present device and method can suppress occurrence of cracks at an area below a bump electrode upon the bonding of an inner lead and can achieve an enhanced heat resistance cycle property after the bonding of the inner lead.

Additional objects and advantages of the invention will be set forth in the description which follows, and in part will be obvious from the description, or may be learned by practice of the invention. The objects and advantages of the invention may be realized and obtained by means of the instrumentalities and combinations particuarly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
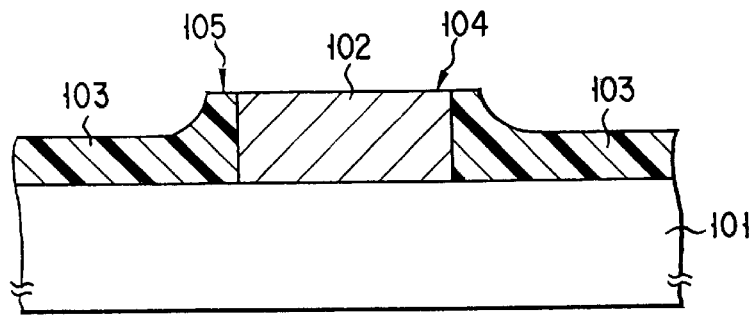
FIG. 1 is a cross-sectional view showing a major portion of a conventional semiconductor device equipped with a bump electrode.
Figure 2:
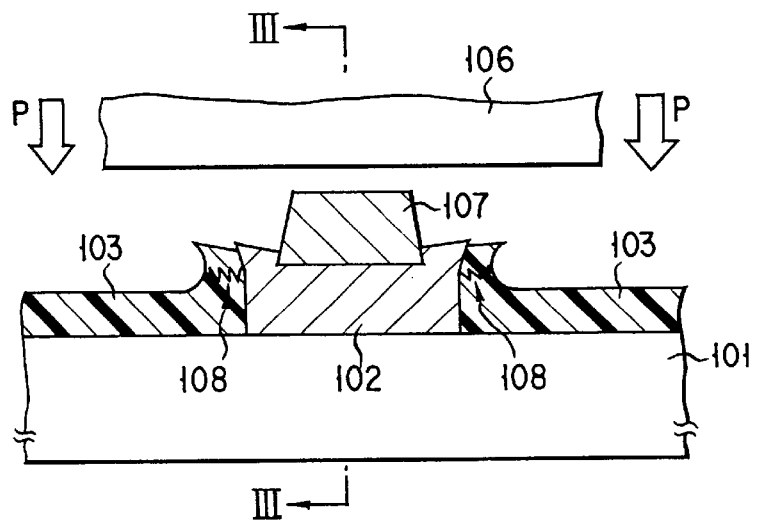
FIG. 2 is a cross-sectional view showing a major portion of the semiconductor device at a step of connecting an inner lead to the bump electrode.
Figure 3:
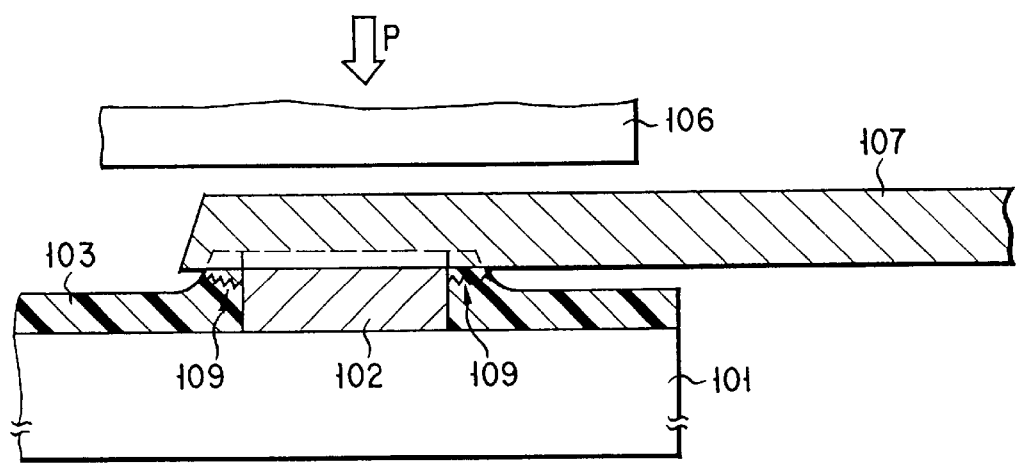
FIG. 3 is a cross-sectional view, taken along line III—III in FIG. 2.
Figure 4:
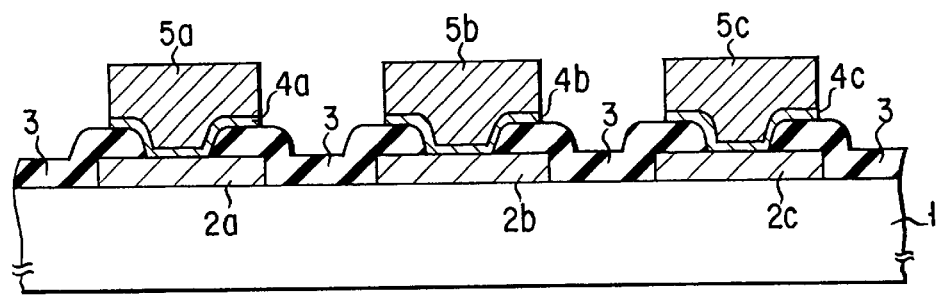
FIGS. 4 to 7 are cross-sectional views showing the steps of manufacturing a semiconductor device of the present invention.

As shown in FIG. 4, aluminum electrode pads 2a, 2b and 2c are formed on a silicon substrate 1 having semiconductor elements, not shown, formed therein and are electrically connected to the semiconductor elements. The electrode pads 2a, 2b and 2c are formed, in actual practice, over the substrate 1 with an insulating film provided therebetween, but in the present specification the substrate 1 is intended to mean a semiconductor integrated circuit (IC) with such an insulating film, etc., provided therebetween in which case the details of the substrate inner structure are omitted for brevity's sake. A passivation film 3, such as phosphosilicate glass (PSG) or silicon nitride, is formed on the substrate 1 including the electrode pads 2a, 2b and 2c. The passivation film 3 includes openings leading to the electrode pads 2a, 2b and 2c. Metal layers 4a, 4b and 4c are provided on the passivation layer 3 at those areas near these openings such that they provide a Pd(palladium)-Ni(nickel)-Ti(titanium)-stacked layer structure each. The metal layers 4a, 4b and 4c are of the order of 4000 angstroms and electrically connected to the electrode pads 2a, 2b and 2c, respectively, via the corresponding openings. About 18±2 μm-thick bump electrodes 5a, 5b and 5c electroplated with gold are provided on the metal layers 4a, 4b and 4c, respectively.

Figure 5:
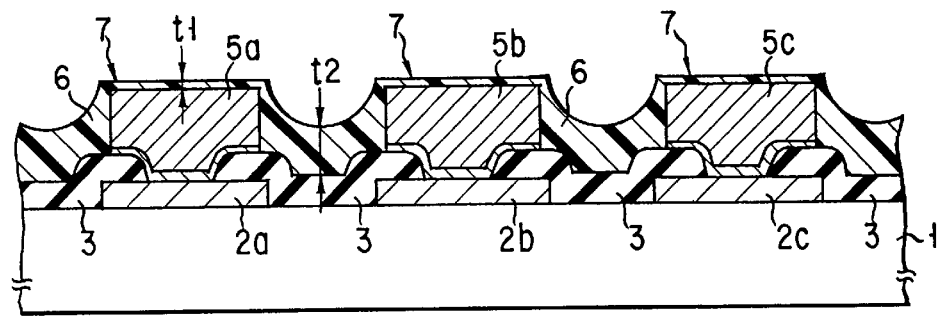

A polyimide resin solution of about 1000 cP is dropwise applied to the device shown in FIG. 4 by sequentially spinning the substrate structure, including the bump electrodes 5a, 5b and 5c, at 500 rpm for 10 seconds and 1000 to 1200 rpm for 10 seconds. Then the polyimide resin solution on the semiconductor structure is dried in an $N_2$ gas atmosphere at 150° C. for 60 minutes and solidified to provide a polyimide resin film 6, specifically, about 1 to 2 μm thick ($t_1$ in FIG. 5) over the bump electrodes 5a, 5b and 5c and 7 to 8 μm thick ($t_2$ in FIG. 5) over the passivation film 3.

Figure 6:
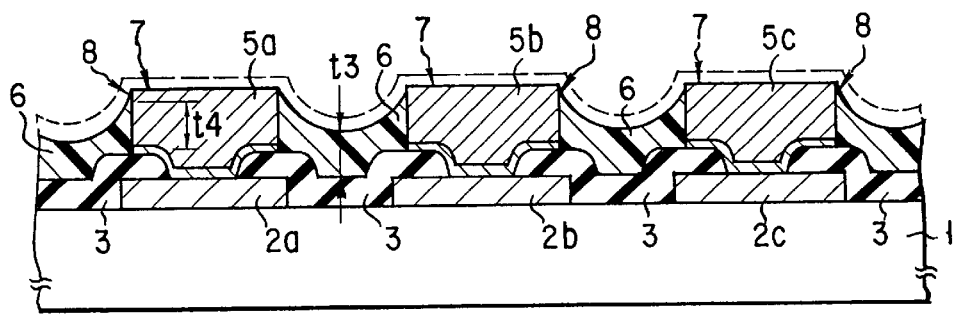

Then a choline solution is spin-sprayed on the substrate structure at a 450 rpm for 30 seconds with an ordinary scan nozzle type developing apparatus using a positive resist. By so doing, the polyimide resin film 6 is wholly etched back as shown in FIG. 6 to expose top areas 7 of the bump electrodes 5a, 5b and 5c. Through a further etch-back process the top areas 7 of the bump electrodes 5a, 5b and 5c are more projected than those top areas 8 of the polyimide resin film 6. At this time, the choline solution does not substantially etch the gold but only the polyimide resin film 6 is effectively etched away. It is preferred that the etch-back time period be so set as to achieve a film thickness $t_2$ (FIG. 5) of about 5 to 6 μm for instance. The polyimide resin film 6 is finally solidified in an $N_2$ gas atmosphere at 320° C. to obtain a polyimide resin film 6 as a protective film having a thickness of 4 to 5 μm ($t_3$ in FIG. 6) over the passivation film 6. At that time, if the height ($t_4$ in FIG. 6) of the polyimide resin film 6 surrounding the bump electrode (5a, 5b, 5c) is at least about 20% that of the bump electrode, there is no risk that the humidity resistance, as well as the heat resistance cycle property as will be set out below, will be impaired. As an upper limit, the top area 7 is more projected than the top area 8 to an extent that the lead is pushed in, taking into consideration the fact that deformation occurs at a subsequent step as will be set out below. The push-in amount of the lead, variously varying in the precision of the bonding tool, is about 4 μm on a present ordinary tool. In order to satisfy such a condition the height $t_4$ of the polyimide resin film 6 was set to be about 4 μm in the present embodiment. In this case, if the bump electrodes 5a, 5b and 5c are 18±2 μm high, the bump electrodes are surrounded with the polyimide resin film 6 at about their 20% height level and the top area 7 is about 12 to 16 μm as high as the top area 8.

Figure 7:
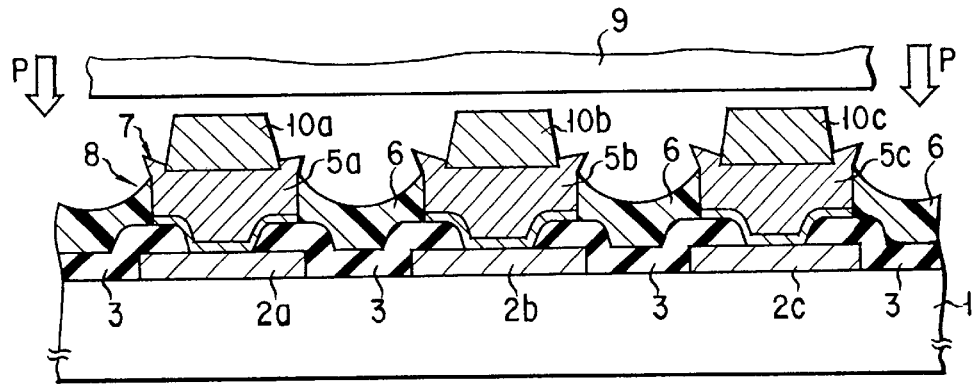
Figure 8:
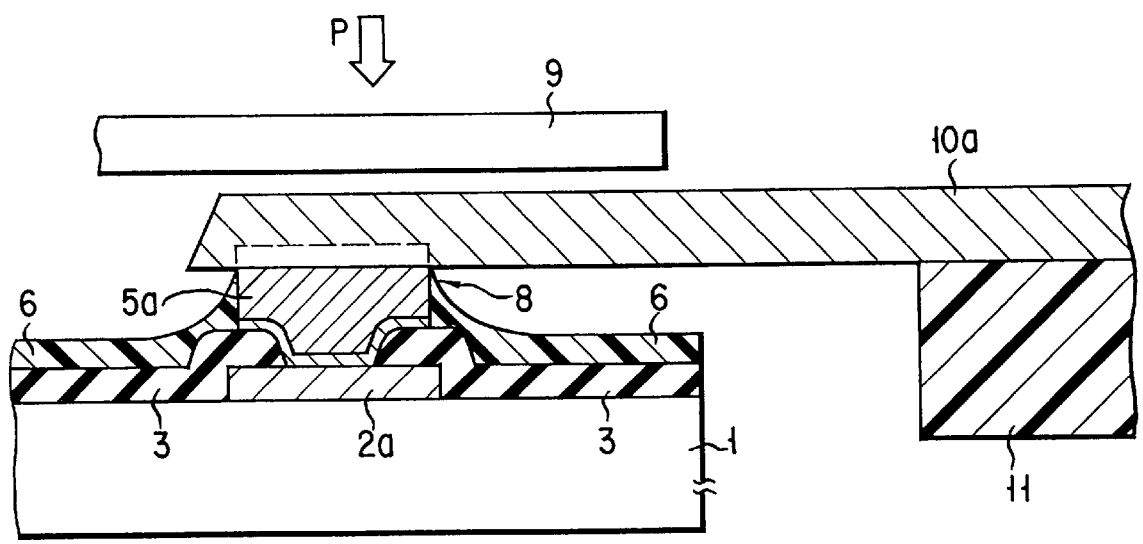
FIG. 8 is a vertical cross-sectional view, as taken along a longitudinal direction, showing a lead and semiconductor device at the manufacturing step shown in FIG. 7.

As shown in FIG. 7, TAB type leads 10a, 10b and 10c are thermocompression-bonded to the bump electrodes 5a, 5b and 5c by applying a pressure P and heat to a bonding tool 9. FIG. 8 is a side, cross-sectional view taken in a longitudinal direction of the lead 10a in FIG. 7. The lead 10a as shown in FIG. 8 is arranged, as an inner lead, on a film carrier tape 11 of a polyimide resin.

With the aforementioned semiconductor device, even if the leads 10a, 10b and 10c are pushed into the bump electrodes 5a, 5b and 5c by the pressure P of the bonding tool 9 and deformed, it is possible to suppress occurrence of cracks in the polyimide resin film 6 because the top area 7 is more projected than the top area 8 of the polyimide resin film 6.

Since the top area 7 is more projected than the top area 8, the leads 10a, 10b and 10c are not contacted with the polyimide resin film 6 even under the application of that pressure and the polyimide resin film 6 is prevented from being heat-affected even upon the thermocompression bonding of the leads 10a, 10b and 10c to the bump electrodes.

According to the aforementioned embodiment, the polyimide film 6 serving as a surface protective film is composed of the same-based polyimide resin as that of the film carrier tape 11. As one form of application, for example, the polyimide resin film 6 is formed of CRC-6061 (trade name) manufactured by Sumitomo Bakelite Co., Ltd. and the film carrier tape 11 is formed of UPILEX (trade name) manufactured by Ube Industries Ltd.

Since the polyimide resin film 6 and film carrier tape 11 are made of the same-based resin, a better heat resistance cycle property can be obtained in a semiconductor device. To be specific, the thermal expansion coefficient of the tape 11 and that of the resin film (surface protective film) 6 become substantially the same and, even if the tape 11 is repeatedly expanded and contracted, the resin film 6 is correspondingly expanded and contracted in repeated fashion. To put it in another way, there is almost no difference between the thermal expansion coefficient of the resin film 6 and that of the tape 11 and hence any stress is hard to involve in the resin film 6 near the bump electrodes 5a, 5b and 5c, the passivation film 3, the substrate 1, etc.

The resin film (surface protective film) 6 is formed of the polyimide resin in an TAB-FP and hence the polyimide resin is particularly effective because it serves as a buffer member against a shearing stress the molded resin applies to the chip.

Figure 9:
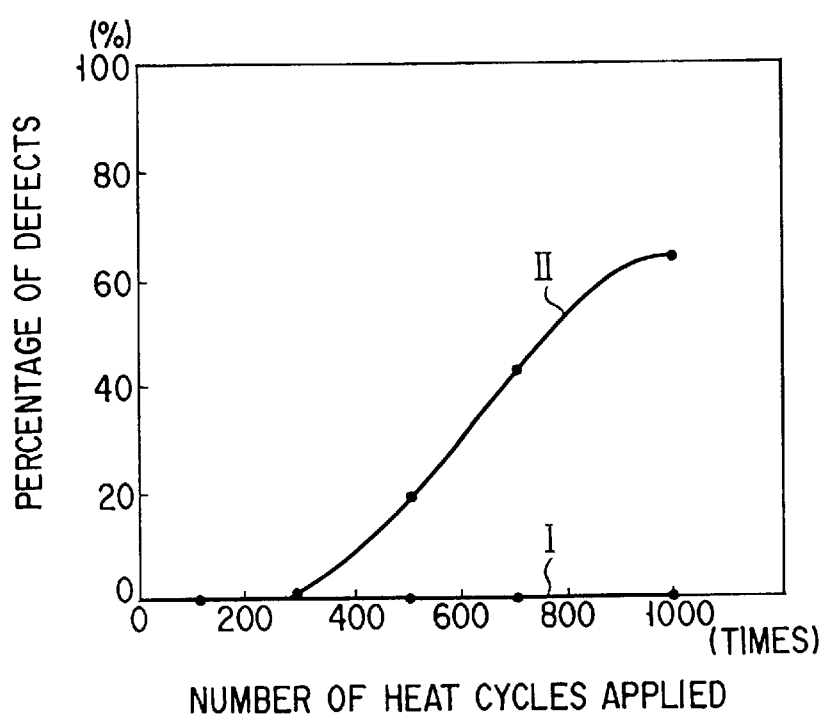
FIG. 9 is a graph showing the result of a thermal cycle test (TCT) against a semiconductor device of the present invention.

FIG. 9 is a graph showing the result of a TCT (thermal cycle test) carried out under the MIL Standard. In the graph of FIG. 9 the ordinate and abscissa represent the percent of defects and the number of heat cycles applied, respectively.

The line I in the graph of FIG. 9 denotes TAB-FP as explained in connection with the embodiment. As will be seen from the line I in FIG. 9, there are almost no defective products in TAB-FP, to which the present invention is applied, even if 1000 heat cycles are applied. The line II in the graph of FIG. 9 shows TAB-FP where no polyimide resin film 6 is formed. From the graph it will be seen that defective products tend to increase with an increase in the number of thermal cycles applied.

From the result of tests it has been confirmed that the heat resistance cycle property of the device is improved. The improved heat resistance cycle property obtained is probably due to the fact that (1) added strength is imparted to the bump electrodes 5a, 5b and 5c, around which the resin film 6 is provided, and that (2) an enhanced heat compatibility is achieved through the use of substantially the same type of resin of which the resin film 6 and tape 11 are formed.

The improvement (1) as set out above is probably ascribable largely to the presence of the resin film 6 with which the bump electrodes 5a, 5b and 5c are firmly surrounded. To be specific, the polyimide resin film 6 around which the bump electrodes 5a, 5b and 5c are provided serves as an adequate resistance both to a residual stress resulting from a thermal expansion coefficient difference upon the bonding of the leads 10a, 10b and 10c and to a variation of the bump electrodes 5a, 5b and 5c under a bonding load. Further, the polyimide resin film 6 also serves as a resistance to a heat stress the bump electrodes 5a, 5b and 5c receive from the leads 10a, 10b and 10c. Therefore, cracks are hard to produce in the oxide film (not shown) provided below the electrode pads 2a, 2b and 2c and in the passivation film 3, etc., provided around the electrode pads 2a, 2b and 2c. This improves the heat resistance cycle property of the device obtained.

Although the present invention has been explained as being applied to the TAB-FP structure, it is not restricted to this type of device. The present invention can also apply to a bump electrode-equipped device, such as a TCP (tape carrier package), a COB (chip on board), a COG (chip on glass) and an SOB (silicon on wafer) structure.

According to the present invention it is possible to obtain the following advantages in actual practice. It is only necessary to use a resin coating, a resin drying and a resin eliminating step and it is not necessary to make any large-scaled investment in a plant and equipmment and to use any photoetching step. A high yield, a low cost and an enhanced microfabrication can be achieved, according to this invention, without involving any lead-shorting problem.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   at least one electrode pad on a surface of the semiconductor substrate, the electrode pad containing aluminum;
   a passivation film covering a surface of the semiconductor substrate and a surface of the electrode pad and having an opening leading to the electrode pad, the passivation film containing an insulator selected from the group consisting of PSG and silicon nitride;
   a metal layer on the surface of the electrode pad at an area of the opening and on the passivation film near the opening, the metal layer containing Pd, Ni and Ti and having a thickness of about 4000 angstroms;
   a bump electrode in contact with the metal layer; and
   resin film covering a surface of the semiconductor substrate except at a top area of the bump electrode, the resin film having a thickness being at least about 20% of a thickness of said bump electrode.

2. A semiconductor device comprising:
   a semiconductor substrate;
   an electrode pad formed on the semiconductor substrate;
   an insulation film formed on the semiconductor substrate to cover the electrode pad, the insulation film having an opening to expose a part of an upper surface of the electrode pad;
   a metal layer formed to cover the part of the upper surface of the electrode pad and the insulation film formed around the opening;
   at least one bump electrode formed on the metal layer to cover a whole upper surface of the metal layer and to allow signals to be input and output to and from the semiconductor device;
   a resin film covering a surface of the semiconductor substrate, the resin film having openings each positioned above the electrode pad and the upper surface of the resin film having a concave shape between adjacent openings, the bump electrode being disposed in the opening of the resin film and projecting a distance above a top surface of the resin film; and
   a passivation film disposed on the surface of the semiconductor substrate and on a surface of the electrode pad, the passivation film having an opening leading to the electrode pad.

3. A semiconductor device comprising:
   a semiconductor substrate;
   at least one electrode pad disposed on a surface of the semiconductor substrate;
   a metal layer in contact with the electrode pad;
   a resin film covering the surface of the semiconductor substrate, the resin film having openings each positioned above the electrode pad to expose a whole upper surface of the metal layer and the upper surface of the resin film having a concave shape between adjacent openings;
   a bump electrode disposed in the opening of the resin film and in contact with the metal layer to cover the whole upper surface of the metal layer, the bump electrode projecting a distance above a top surface of the resin film; and
   a passivation film disposed on the surface of the semiconductor substrate and on a surface of the electrode pad, the passivation film having an opening leading to the electrode pad.

4. A semiconductor device comprising:
   a semiconductor substrate;
   at least one electrode pad disposed on a surface of the semiconductor substrate;
   a metal layer in contact with the electrode pad:
   a resin film covering the surface of the semiconductor substrate, the resin film having an opening positioned above the electrode pad;
   a bump electrode disposed in the opening of the resin film and in contact with the metal layer, the bump electrode protecting a distance above a top surface of the resin film, said projection distance reducing heat induced defects and absorbing pressure exerted on a top area of the bump electrode to suppress occurrence of cracks in the resin film; and
   a film carrier tape formed of a resin substantially the same as a resin of the resin film, the film carrier tape including a lead having an end portion connected to the bump electrode.

5. A semiconductor device comprising:
   a semiconductor substrate;
   at least one electrode pad disposed on a surface of the semiconductor substrate;

a passivation film disposed on the surface of the semiconductor substrate and on a surface of the electrode pad, the passivation film having an opening leading to the electrode pad;

a metal layer disposed on the electrode pad surface and on a surface of the passivation film adjacent to the opening;

a resin film disposed on the surface of the passivation film, the resin film having openings each positioned above the opening of the passivation film and the upper surface of the resin film having a concave shape between adjacent openings;

a bump electrode disposed in the opening of the passivation film and in the opening of the resin film, the bump electrode being in contact with a whole upper surface of the metal layer and projecting a distance above a top surface of the resin film.

6. The semiconductor device of claim 5, wherein a height of a portion of the bump electrode projecting above the top surface of the resin film is about 4 $\mu$m.

7. The semiconductor device as recited in claim 5, wherein a thickness of said resin film is about 4 to 5 $\mu$m.

8. A semiconductor device as recited in claim 5, wherein said electrode pad contains aluminum.

9. A semiconductor device as recited in claim 5, wherein said passivation film contains an insulator selected from the group consisting of PSG and silicon nitride.

10. A semiconductor device as recited in claim 5, wherein said metal layer contains Pd, Ni and Ti.

11. A semiconductor device as recited in claim 5, wherein said metal layer has a thickness of about 4000 angstroms.

12. A semiconductor device as recited in claim 5, wherein a thickness of said resin film is within a range of 4 to 5 $\mu$m.

* * * * *

UNITED STATES PATENT AND TRADEMARK OFFICE
CERTIFICATE OF CORRECTION

PATENT NO.   : 6,404,051 B1
DATED        : June 11, 2002
INVENTOR(S)  : Ezawa et al.

It is certified that error appears in the above-identified patent and that said Letters Patent is hereby corrected as shown below:

Column 6,
Line 48, change "electrode pad:" to -- electrode pad; --.

Signed and Sealed this

Twenty-fifth Day of March, 2003

JAMES E. ROGAN
*Director of the United States Patent and Trademark Office*